United States Patent [19]

Tzeng et al.

[11] Patent Number: 5,142,552
[45] Date of Patent: Aug. 25, 1992

[54] METHOD AND APPARATUS FOR ANALOG D.C. OFFSET CANCELLATION

[75] Inventors: Jeremy Tzeng, Matawan, N.J.; Chris Cole, Los Altos; Steve Levy, Nevada City, both of Calif.

[73] Assignee: Silicon Systems, Inc., Tustin, Calif.

[21] Appl. No.: 508,496

[22] Filed: Apr. 10, 1990

Related U.S. Application Data

[63] Continuation of Ser. No. 158,344, Feb. 22, 1988, abandoned.

[51] Int. Cl.⁵ .............................................. H03H 7/30
[52] U.S. Cl. .................................. 375/14; 364/724.19
[58] Field of Search ........................ 375/11, 12, 13, 14, 375/99, 103; 333/18; 364/724.19, 724.2

[56] References Cited

U.S. PATENT DOCUMENTS

| | | | |
|---|---|---|---|
| 3,943,448 | 3/1976 | Motley et al. | 375/14 |
| 4,021,738 | 5/1977 | Gitlin et al. | 375/14 |
| 4,384,355 | 5/1983 | Werner | 333/18 |
| 4,571,732 | 2/1986 | Piriani et al. | 375/12 |
| 4,646,325 | 2/1987 | Zuranski et al. | 375/14 |

*Primary Examiner*—Stephen Chin
*Attorney, Agent, or Firm*—Hecker & Harriman

[57] ABSTRACT

The present invention utilizes a decision feedback equalizer (DFE)/finite impulse response filter. A plurality of taps of the equalizer supply coefficients to the input function and are updated in a feedback loop. An additional DC tap is provided, with a constant value as its input source. Within reasonable limits, the constant term (i.e. D.C.) in an analog input signal is subtracted out by the action of the constant value DC tap. The coefficients are updated by a decision feedback means such that phase, amplitude and DC offset may all be corrected. In the preferred embodiment, the filter is a T/2 spaced filter in which two samples per baud are utilized by the filter. The filter outputs a complex word which is coupled to a quantizer. The actual constellation locations are compared to the ideal locations in a difference block so that offset errors may be detected. The difference signal is used to update the coefficient values. One of the coefficients so generated is the DC tap in the filter. The product of the modified tap value and the constant input term is combined with the convolutional sum of the input signal to remove constant terms resulting from DC offset in the input signal.

15 Claims, 1 Drawing Sheet 5,142,552

METHOD AND APPARATUS FOR ANALOG D.C. OFFSET CANCELLATION

This is a continuation of application Ser. No. 158,344 filed Feb. 22, 1988 now abandoned.

BACKGROUND OF THE PRESENT INVENTION

1. Field of the Invention

This invention relates to the field of communications transmissions and to a method for extracting the DC component of an analog input signal.

2. Background Art

Communication of data information over the voice network between a sending and receiving station is typically accomplished with a modem (modulator/demodulator). A modem transforms digital information into a form suitable for transmission by modulating it according to a well known modulating scheme. This modulated data is transmitted to a receiving modem, where it is demodulated to produce the original information.

One popular modulation scheme is known as quadrature amplitude modulation (QAM) in which the phase and amplitude of a modulated sine wave carrier signal are utilized to convey information. The QAM signal consists of quadbits which are mapped into a 16 point constellation. Phase and amplitude errors may be introduced into the signal due to analog circuitry associated with the modulation and demodulation of the signal. Typically, an automatic gain control (AGC) circuit is utilized to compensate for variations in amplitude. In addition, a phase locked loop is utilized to correct phase variations. In addition to phase and amplitude errors, there may be introduced to an input signal, a component which creates a DC offset in the QAM constellation. This DC offset is not correctable by prior art phase and amplitude correction methods and therefore requires a separate correction scheme. If not corrected, the DC offset introduces error into the decoding of the information signals.

Therefore, it is an object of the present invention to provide a circuit for correcting DC offset in an analog input signal.

It is another object of the present invention to provide a circuit for correcting DC offset which is substantially decoupled from phase correction and amplitude correction.

It is another object of the present invention to provide a circuit for correction of DC offset and having a resolution suitable for information transmission applications.

SUMMARY OF THE PRESENT INVENTION

The present invention utilizes a decision feedback equalizer (DFE)/finite impulse response filter. A plurality of taps of the equalizer supply coefficients to the input function and are updated in a feedback loop. An additional DC tap is provided, with a constant value as its input source. Within reasonable limits, the constant term (i.e. D.C.) in an analog input signal is subtracted out by the action of the constant value DC tap. The coefficients are updated by a decision feedback means such that phase, amplitude and DC offset may all be corrected. In the preferred embodiment, the filter is a T/2 spaced filter in which two samples per baud are utilized by the filter. The filter outputs a complex word which is coupled to a quantizer. The actual constellation locations are compared to the ideal locations in a difference block so that offset errors may be detected. The difference signal is used to update the coefficient values. One of the coefficients so generated is the DC tap in the filter. The product of the modified tap value and the constant input term is combined with the convolutional sum of the input signal to remove constant terms resulting from DC offset in the input signal.

In operation, a constant term is appended to the input signal to generate a function X(n). The function X(n) is combined with a coefficient function a(n) generated by feedback loops so that the function X(n) may be corrected for phase, amplitude and DC offset variations. The combination W(n) of the coefficient function and the input function is multiplied in the preferred embodiment by a first correction factor to compensate for phase offset, resulting in a signal y(n). The signal y(n) is quantized to generate a signal d(n) representing the ideal constellation points of the input signal. The first correction factor is then removed from d(n) by coupling d(n) and the inverse of the correction factor to a multiplier to generate signal $d_1(n)$ a different signal $\epsilon$ (n) is generated representing the difference between W(n) and $d_1(n)$. The difference signal is combined with the coefficient function to update the coefficient function. The constant term appended to the input signal is multiplied by an updated coefficient so that DC offset terms in the input signal may be cancelled out.

DETAILED DESCRIPTION OF THE PRESENT INVENTION

A method and apparatus for extracting analog d.c. offset is described. In the following description, numerous specific details, such as number of taps, resolution, etc., are described in detail in order to provide a more thorough description of the present invention. It will be obvious, however, to one skilled in the art, that the present invention may be practiced without these specific details. In other instances, well known features have not been described in detail in order not to unnecessarily obscure the present invention.

The present invention comprises an equalizer/FIR filter for receiving a modulated analog input signal. The FIR filter is an 11 tap filter in the preferred embodiment, which includes a DC tap to remove DC offset from the incoming signal. In the preferred embodiment, the FIR filter is a T/2 spaced equalizer in which two samples per baud are utilized by the filter. Each of the taps in the filter is multiplied by a corresponding coefficient generated by the appropriate decision error. The feedback loops are utilized to correct phase and amplitude variations. The output of the filter is a complex word.

The complex word is coupled to a quantizer which outputs ideal constellation locations. The complex signal and quantized signal are coupled to a difference error block to generate an offset between the ideal and actual constellation locations. This difference error is used to update the coefficients of the equalizer taps. In the present invention, one of the taps is a DC tap. The input to the DC tap is set to a constant value in the preferred embodiment of the present invention. The product of the constant input and its coefficient is added to the convolutional sum of the input signal so that the DC term existing in the input signal may be subtracted out. By adjusting the coefficient of this constant input term, the DC offset in the input signal is removed.

Figure 2A:
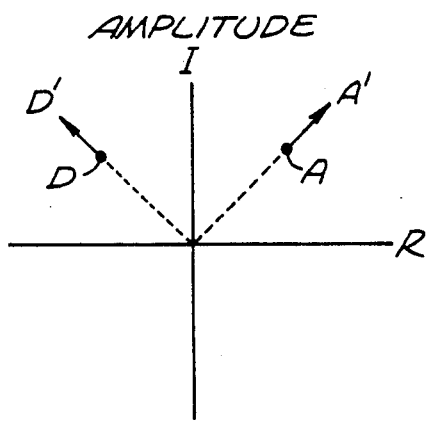
FIG. 2A–2C are graphs illustrating constellation point offset due to amplitude, phase and DC components.
Figure 2B:
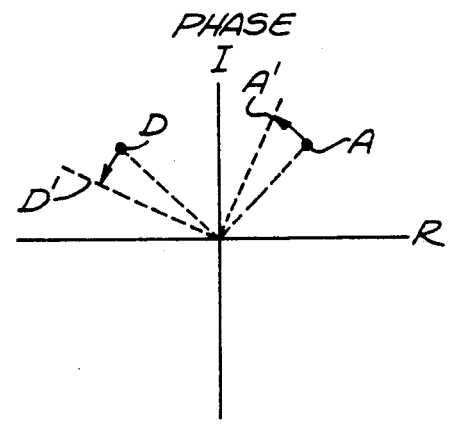
Figure 2C:
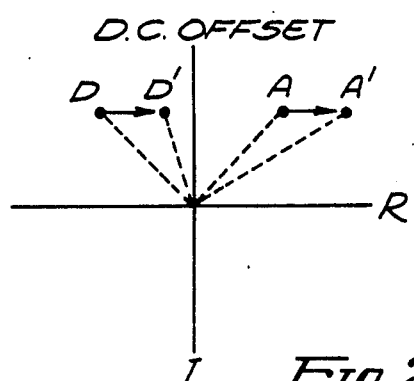

FIGS. 2A-2C illustrate types of offset which may be introduced to a complex input signal. In each figure, the horizontal axis represents changes in the real portion of the complex term and the vertical axis represents changes in the imaginary portion of the complex signal. Referring first to FIG. 2A, the effect of amplitude variations on a single QAM constellation point is illustrated. In FIG. 2A, constellation points A and D are illustrated in the first and second quadrants respectively. These constellation points A and D represent the terminal of a vector whose origin is coincident with the origin of the coordinate system. An increase in the amplitude of the input signal results in the constellation points being shifted to points A' and D' respectively. Points A' and D' in FIG. 2A are colinear with the original vectors defined by points A and D respectively, but further from the origin. As noted previously, an automatic gain control circuit may be utilized to control such amplitude variations.

Referring now to FIG. 2B, error due to phase offset is illustrated. Again, constellation points A and D represent ideal constellation points. A phase shift error results in the vector shifting by an angle $\theta$ in the direction of the phase shift so that the actual constellation points are at A' and D' respectively. The amplitude at both A and A' is equal. However, the angle with respect to the horizontal access is changed by an amount $\theta$. This phase offset may be corrected through use of a phase locked loop.

FIG. 2C illustrates DC offset introduced into an input signal. In the example shown, the DC offset is in the direction of the real axis. The DC offset results in a change at location A' of both the phase and the amplitude of the signal. However, this change cannot be corrected by the same methods of correction for amplitude and phase offset. Still referring to FIG. 2C, we see that, for the same amount of DC offset, the amplitude at constellation point A' has been increased while the amplitude at constellation point D' has been decreased. If a gain factor is introduced to correct the amplitude of one of the constellation points, the same gain factor applied to the remaining constellation point would result in further error. In addition, consider the situation in which the DC offset is in the direction of the imaginary axis. In such a situation, the amplitude of the constellation points would be equal but the change in phase angle would be in opposite directions. Therefore, a phase correction would not correct both constellation points. Thus, a separate method of correcting for DC offset is required.

In the preferred embodiment of the present invention, the DC offset correction circuitry is utilized as part of a receive channel in a modem such as is illustrated in U.S. patent application Ser. No. 157,986, filed on Feb. 19, 1988, and entitled PHASE JITTER TRACKER and assigned to the assignee of the present invention and in U.S. patent application Ser. No. 157,988, filed on Feb. 19, 1988, and entitled METHOD AND APPARATUS FOR TWO STAGE AUTOMATIC GAIN CONTROL and assigned to the assignee of the present invention. The teachings of these patent applications are incorporated herein by this reference.

Figure 1:
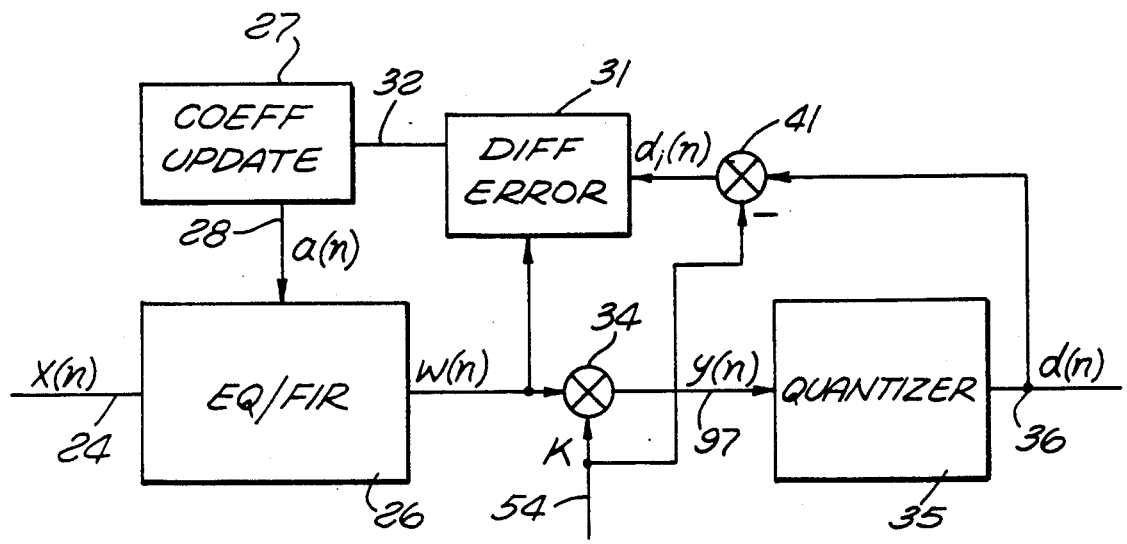
FIG. 1 is a block diagram illustrating the tap update including DC correction circuitry of the present invention.

Referring to FIG. 1, a block diagram of the preferred embodiment of the present invention is illustrated. The input signal X(n) 24 is coupled to EQ/FIR 26. The EQ/FIR 26 has a plurality of taps, each multiplied by a corresponding coefficient from coefficient update block 27. The coefficients are updated by the difference error feedback loop for phase, amplitude and DC offset correction. The output of EQ/FIR 26 is a complex word W(n) which is multiplied at phase coefficient 34 by a correction signal 54 which is used to remove phase and frequency offset. This correction signal 54 is generated as described in the above mentioned Patent Applications: on pages 12-13 of PHASE JITTER TRACKER, and on pages 10, 13-14 of METHOD AND APPARATUS FOR TWO STAGE AUTOMATIC GAIN CONTROL. This signal does not affect D.C. offset information W(n). The output 97 of phase correction 34 is a signal Y(n) which is nomally phase and frequency corrected. This signal is coupled to a quantizer 35 which is used to generate the ideal constellation point locations of the QAM signal. The output 36 of the quantizer 35 is a signal d(n) representing these ideal constellation points.

The quantized signal d(n) 36 is coupled to multiplier 41 along with the inverse of correction factor. The output of K multiplier 41 is coupled to differential error 31. Differential error block 31 generates the difference between the W(n) and $d_1(n)$. The output 32 of differential error block 31 is coupled to coefficient update block 27. The output 28 of coefficient update block 27 is coupled to the EQ/FIR 26.

The input signal X(n) is represented by the function:

$$X(n) = [X(n), X(n-1) \ldots X(n-9), X_{dc}].$$

Where $X_{dc}$ is a constant term.
The coefficient A(n) is given by the function:

$$a(n) = [a_0(n), a_1(n), \ldots a_{10}(n)]$$

Therefore, signal W(n) is given by the function:

$$W(n) = x(n)a^*(n) = \sum_{i=0}^{9} x(n-i)a_i(n) + \ldots x_{dc}a_{10}(n)$$

The purpose of the coefficient update block is to minimize the difference between W(n) and $d_1(n)$
$$E \| W(n) - d_1(n) \|^2$$

The coefficient update equation is as follows:
$$\epsilon(n) = W(n) - d_1(n)$$
complex $$a_j(n) = a_j(n-1) - \beta \cdot x(n-j) \cdot \epsilon(n)$$

$$j = 0, \ldots, 10$$

for all n.

As noted previously, in the preferred embodiment of the present invention, there are eleven taps. The input source for 10 of the taps is the input signal itself. The input for the 11th tap is a constant selected to correct DC offset. The coefficients for all the taps are updated in an identical fashion in the feedback loop. The product of the constant term and the coefficient at the 11th tap is added into the convolutional sum W(n) of the input signal so that a DC term may be subtracted out. The constant term is adjusted by a coefficient to match the DC offset. The constant value is selected so that the circuit will have a maximum gain given a certain amount of offset correction capability. Initially, the maximum anticipated offset to be corrected is calculated. That value is divided by the maximum permissable value of a coefficient to calculate $X_{dc}$.

We claim:

1. A method for removing DC offset from an input signal comprising the steps of:
    appending a constant term to said input signal to generate a first function;
    multiplying said first function by a coefficient function and generating a first output signal;
    transforming said first output signal into an ideal signal;
    comparing said first output signal and said ideal signal and providing a difference signal representing a difference between said first output signal and said ideal signal;
    combining said difference signal with said coefficient function to update said coefficient function and correct for errors in said input signal.

2. The method of claim 1 wherein the step of appending a constant term to said input signal is performed by coupling said input signal to an equalizer/FIR filter having a plurality of taps, one of said taps having said constant term.

3. The method of claim 1 wherein said step of transforming said first output signal into an ideal signal is performed by quantizing said first output signal.

4. The method of claim 1 wherein said step of multiplying said first function by said coefficient function is a vector multiplication.

5. The method of claim 1 wherein said coefficient function is given by:

$$a(n) = [a_0(n), a_1(n), \ldots a_{10}(n)]$$

6. A method for removing DC offset from an input signal comprising the steps of:
    generating a first function $X(n)$ by appending a constant term to said input signal;
    combining said first function with a coefficient function $a(n)$ to produce a first output signal $W(n)$;
    multiplying said first output signal by a first correction factor to correct phase offset and produce a second output signal $y(n)$;
    transforming said second output signal into an ideal signal $d(n)$;
    multiplying said ideal signal by the inverse of said correction factor to generate a third output signal $d_1(n)$;
    generating a difference signal $\epsilon(n)$ representing a difference between said first output signal and said third output signal;
    combining said difference signal with said coefficient function to update said coefficient function.

7. The method of claim 6 wherein said first function $X(n)$ is given by:

$$X(n) = [X(n), X(n-1) \ldots X(n-9), X_{dc}]$$

8. The method of claim 7 wherein said coefficient function is given by:

$$a(n) = [a_0(n), a_1(n), \ldots a_{10}(n)]$$

9. The method of claim 8 wherein said step of combining said first function with said coefficient function to produce said first output function $W(n)$ is given by:

$$W(n) = x(n)a^*(n) = \sum_{i=0}^{9} x(n-i)a_i(n) + \ldots x_{dc}a_{10}(n)$$

10. The method of claim 9 wherein said difference signal $\epsilon(n)$ is given by:

$$\epsilon(n) = W(n) - d_1(n)$$

11. The method of claim 10 wherein said step of combining said difference signal with said coefficient function is given by:

$$a_j(n) = a_j(n-1) - \beta \cdot x(n-j) \cdot \epsilon(n)$$

$$j = 0, \ldots, 10$$

for all n.

12. The method of claim 11 wherein said step of combining said first function and said coefficient function is accomplished in an equalizer/FIR filter.

13. The method of claim 12 wherein said ideal signal is generated by quantizing said second output signal.

14. A method for removing DC offset from an input signal comprising the steps of:
    appending a constant term to said input signal to generate a first function;
    multiplying said first function by a coefficient function and generating a first output signal;
    transforming said first output signal by quantizing said first output signal into an ideal signal;
    comparing said first output signal and said ideal signal and providing a difference signal representing a difference between said first output signal and said ideal signal;
    combining said difference signal with said coefficient function to update said coefficient function and correct for errors in said input signal.

15. A method for removing DC offset from an input signal comprising the steps of:
    generating a first function $X(n)$ by appending a constant term to said input signal;
    combining said first function with a coefficient function $a(n)$ to produce a first output signal $W(n)$;
    multiplying said first output signal by a first correction factor to correct phase offset and produce a second output signal $y(n)$;
    transforming said second output signal into an ideal signal $d(n)$ by quantizing said second output signal;
    generating a difference signal $\epsilon(n)$ representing a difference between said second output signal and said ideal signal;
    combining said difference signal with said coefficient function to update said coefficient function.

* * * * *